(12) United States Patent
Mandelman et al.

(10) Patent No.: US 8,587,062 B2
(45) Date of Patent: Nov. 19, 2013

(54) SILICON ON INSULATOR (SOI) FIELD EFFECT TRANSISTORS (FETS) WITH ADJACENT BODY CONTACTS

(75) Inventors: Jack A. Mandelman, Flat Rock, NC (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 655 days.

(21) Appl. No.: 11/690,975

(22) Filed: Mar. 26, 2007

(65) Prior Publication Data

US 2008/0237708 A1  Oct. 2, 2008

(51) Int. Cl.
*H01L 27/12* (2006.01)

(52) U.S. Cl.
USPC ........... 257/347; 257/353; 257/354; 257/388; 257/412; 257/413; 257/E27.112

(58) Field of Classification Search
USPC .......... 257/437, E27.112, 386, 354, 340, 347, 257/368, 353
See application file for complete search history.

(56) References Cited

U.S. PATENT DOCUMENTS

| | | | |
|---|---|---|---|
| 4,965,213 A | 10/1990 | Blake | |
| 5,283,457 A * | 2/1994 | Matloubian | 257/351 |
| 5,559,368 A | 9/1996 | Hu et al. | |
| 5,821,769 A | 10/1998 | Douseki | |
| 6,060,750 A | 5/2000 | Hisamoto et al. | |
| 6,100,564 A * | 8/2000 | Bryant et al. | 257/347 |
| 6,159,807 A * | 12/2000 | Bryant et al. | 438/289 |
| 6,429,487 B1 * | 8/2002 | Kunikiyo | 257/354 |
| 6,521,948 B2 * | 2/2003 | Ebina | 257/347 |
| 6,642,579 B2 * | 11/2003 | Fung | 257/347 |
| 6,703,280 B2 * | 3/2004 | Kim et al. | 438/301 |
| 6,724,048 B2 | 4/2004 | Min et al. | |
| 6,940,130 B2 * | 9/2005 | Bryant et al. | 257/350 |
| 6,953,738 B2 * | 10/2005 | Veeraraghavan et al. | 438/479 |
| 7,135,742 B1 * | 11/2006 | Harada et al. | 257/347 |
| 2002/0048972 A1 * | 4/2002 | Yamaguchi et al. | 438/926 |
| 2002/0079544 A1 * | 6/2002 | Shino | 257/388 |

* cited by examiner

*Primary Examiner* — S. V. Clark
*Assistant Examiner* — Jesse Y Miyoshi
(74) *Attorney, Agent, or Firm* — Law Office of Charles W. Peterson, Jr.; H. Daniel Schnurmann

(57) ABSTRACT

A field effect transistor (FET) with an adjacent body contact, a SOI IC with circuits including the FETs and a method of fabricating the ICs. Device islands are formed in the silicon surface layer of a SOI wafer. Gates are defined on the wafer. Body contacts are formed in a perimeter conductive region adjacent to the gates. The body contacts may be either a silicide strap along the gate sidewall at one side of the FET or a separate contact separated from the gate by a dielectric stripe at one side of the FET. Separate contacts may be connected to a bias supply.

20 Claims, 16 Drawing Sheets

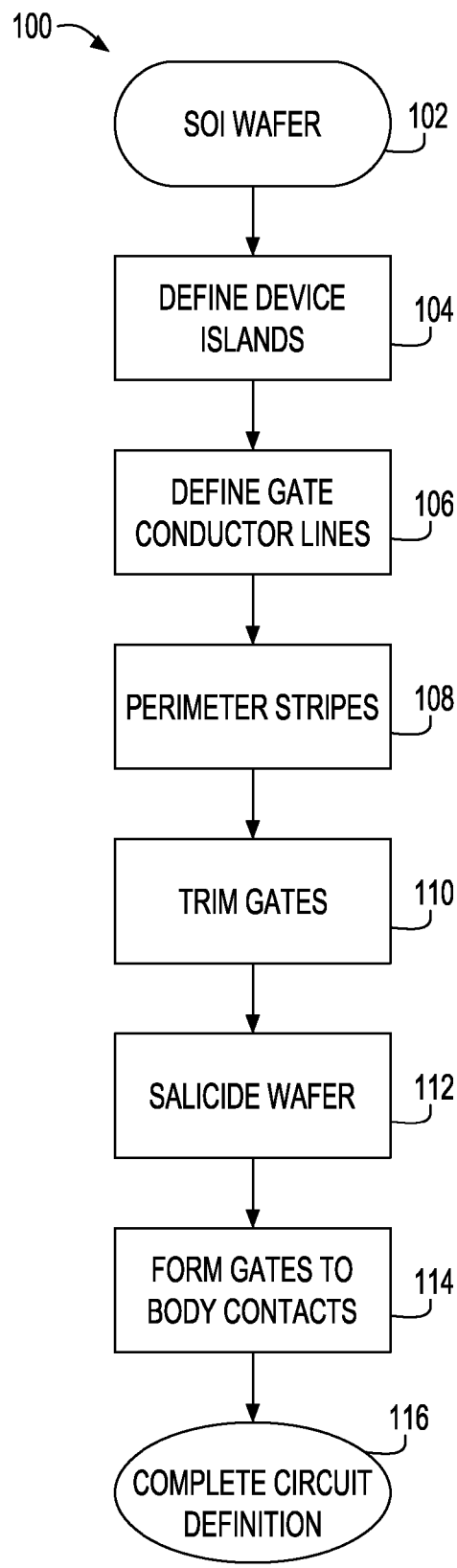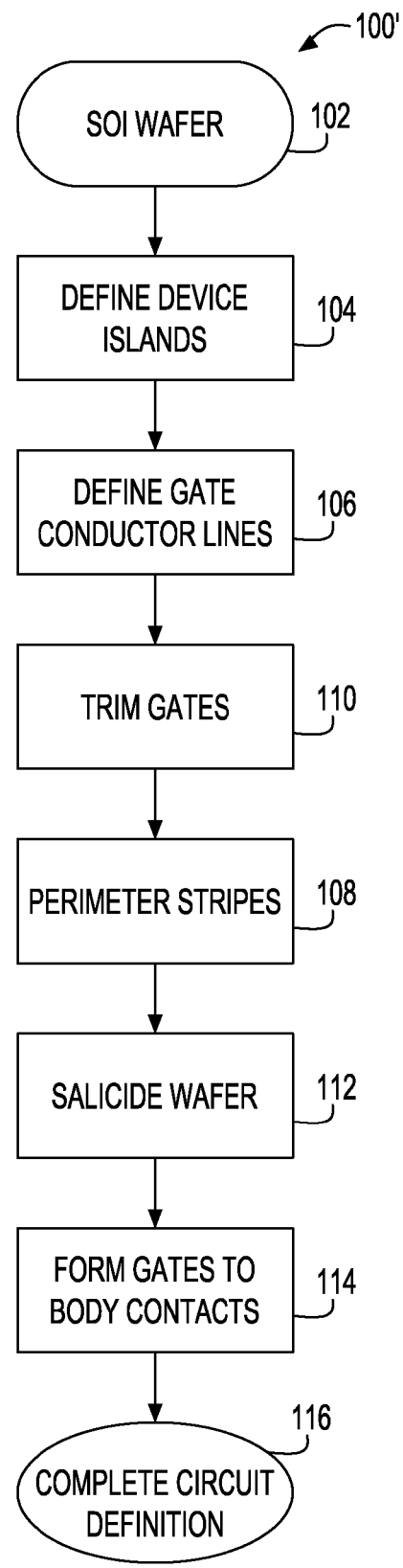
FIG. 2A
FIG. 2B

SILICON ON INSULATOR (SOI) FIELD EFFECT TRANSISTORS (FETS) WITH ADJACENT BODY CONTACTS

BACKGROUND OF THE INVENTION

1. Field of the Invention

The present invention is related to Integrated Circuit (IC) chips and more particularly to providing body bias to Field Effect Transistors (FETs) in CMOS IC chips.

2. Background Description

Bulk silicon field effect transistors (FETs) are formed on the surface of a silicon chip or wafer. In the insulated gate FET technology typically referred to as CMOS, the silicon wafer or substrate may be of one conduction type, e.g., P-type, and areas or wells of a second conduction type, e.g., N-type, are formed in the P-type wafer. N-type FETs (NFETs) are formed on the surface of the P-type wafer and P-type FETs (PFETs) are formed on the surface of the N-wells. A first bias voltage, typically zero volts (0.0V) or ground (GND), is applied to the substrate to bias the NFETs and a second bias voltage, typically the supply voltage ($V_{hi}$), is applied to the N-wells. The substrate and N-well bias voltages help to stabilize respective FET electrical characteristics, including improving threshold voltage ($V_T$) and device current stability. Changing a device bias changes device characteristics, increasing/decreasing device $V_T$ and decreasing/increasing device operating current, depending upon the magnitude and direction of the respective change. Performance improvements for these prior art bulk transistor technologies has been achieved, normally, by reducing feature size or "scaling."

Transistor and circuit performance improvements have also come from the movement to silicon on insulator (SOI) where separate FETs are formed in a surface silicon layer. However, typically, SOI FETs are unbiased and so, suffer from what are known as body effects and history effects.

FIG. 1A shows a cross section of a prior art SOI wafer through a single FET 52 that may be an NFET or a PFET. The FET 52 is formed in a thin silicon surface layer 54 that is isolated from an underlying silicon substrate 56 by a buried oxide (BOX) layer 58. In a typically complex series of mask steps, SOI islands 60 are formed by etching shallow trenches through the surface layer 54 and filling the shallow trenches with oxide 50 to isolate islands (e.g., 60) from each other. This type of isolation is normally referred to as Shallow trench isolation (STI). STI is used to isolate circuits formed on the islands from each other and, also, isolate the FETs forming the circuits from each other. A gate oxide layer 62 is formed on the surface of the silicon islands 60. Gates 64 are patterned and formed at the device locations. Source/drain regions 66 are defined using standard implant and diffusion steps, e.g., after forming lightly doped diffusion regions (not shown) or with source drain extensions (not shown) at the gate boundaries, if desired. With each device 52, whether NFET or PFET, the source/drain regions 66 in the silicon body form an inherent lateral bipolar transistor, i.e., PNP or NPN, respectively. Once the source drain regions are formed, metal contacts (not shown) are selectively formed at source/drain regions 66 for wiring circuits together and to each other.

Ideally, the thin silicon surface layer 54 is no thicker than what is necessary to form a channel 68 between a pair of source/drain diffusions 66. In practice however, the silicon surface layer 54 is thicker than the depth of the FET's channel layer 68 and, as shown in this example, thicker than device source/drain diffusions 66. Charge stored in the un-inverted layer 70 beneath channel layer 68 of an on FET can act to lower FET threshold, causing device leakage when the device is turned off, e.g., sub-threshold leakage. Further, lowering a device's threshold changes the device's operating characteristics, e.g., making it harder to turn the device off. Charge may accumulate, for example, in an on device located between two off devices, e.g., NFETs in a three way NAND gate. A logic gate with devices that have unintentionally lowered thresholds from stored charge may sporadically operate faster than normal, i.e., when no charge is stored. Thus, a particular path may manifest sporadic race conditions from that stored charge. What is known as partially depleted SOI (PD-SOI) has provided one solution to charge trapping. PD-SOI devices have both lower device junction capacitance and exhibit significantly less dynamic threshold sensitivity to elevated body potential.

FIG. 1B shows an example of the effect of body bias on the I-V curve for a typical state of the art NFET. This example compares having the body is tied to ground 80 or to the source of the device; tide to a positive bias voltage (e.g., 0.6V) 82 slightly below the PN junction turn on voltage; and tied to the gate 84. Grounding the body 80 provides an asymmetric effect with fixed bias conditions in one direction and unfavorably variable in the other. While for some applications, e.g., an inverter or other basic logic gate, this asymmetric characteristic 80 may be beneficial, it is not for others, e.g., for pass gates where balanced operation is desired. Similarly, biasing the body slightly below turn on 82 may be advantageous, e.g., for power device applications, the sub-threshold current can cause unacceptable static or DC power. With the device tied gate to body 84, effectively dynamically biases the device to provide a much crisper characteristic with low sub-threshold current below the 0.2V threshold approaching the body to source bias 80 but with a substantially constant current above, approaching the body to positive bias voltage 84.

By contrast, the device's history of a floating body device may cause the gate to body bias vary much worse than either of the extremes 80, 82, during normal circuit operation. For example, as a floating body device is switched on and off, charged device capacitances may couple the body up or down. As result, logic switching speeds may depend on device history, with a steady state off device slowing a particular logic stage as much as 20-30% in one cycle over another, i.e., where the same device is only in an off state, transitionally. A pass gate multiplexor (Mux), for example, with several parallel such off devices may be especially sensitive to this floating body effect bipolar switching current and, therefore, may suffer random slow propagation delays. Multi stage latches or registers, e.g., pipeline registers, with pass gate coupling between stages may sit in the same state for several cycles with a high at both sides of the pass gates. Where clock gating techniques are used to power down/pause chip sections may well allow body effects to manifest in the registers, slowing reactivation. Memory arrays and static random access memories (SRAMs) in particular may have occasional long accesses from the floating body effects, when a number of cells in the same column or bit line are set the same. Under some floating body conditions, the bipolar current from other cells sharing the same bit lines as half selected SRAM cells (i.e., cells on a selected word line but in unselected columns) may inadvertently switch the half selected cells. These floating body effects pose serious design problems for densely packed SOI circuits such as for example, memory arrays. Intermittent problems may arise, such as an occasional critical path failure, spuriously reading the wrong data or, random cell failures. These types of intermittent problems are notoriously difficult to identify and diagnose. So, floating body effects cause device and circuit non-uniformities that result in difficult to identify sporadic chip failures, sometimes characterized as "soft failures."

Consequently, a number of approaches have been used to bias device bodies and in particular to tie devices body to source (equivalent to) or gate. Unfortunately, prior art approaches have required enlarged shapes for form body contacts and, in some cases, extra device contacts. These enlarged shapes have increased device capacitances, i.e., gate to source-drain diffusion, and/or diffusion to body capacitances.

Thus, there is a need to reduce circuit sensitivity to floating body effects and in particular, to bias devices by tying the device body to a bias without large appurtenant structures that increase device capacitances.

SUMMARY OF THE INVENTION

It is a purpose of the invention to minimize FET body contact overhead;

It is another purpose of the invention to minimize device capacitances in FETs tied gate to body;

It is yet another purpose of the invention to minimize device area in FETs that include body contacts;

It is yet another purpose of the invention to minimize device area in FETs tied gate to body;

It is yet another purpose of the invention to minimize device area and device capacitances in FETs that include body contacts;

It is yet another purpose of the invention to minimize device area and device capacitances in FETs tied gate to body;

It is yet another purpose of the invention to provide a low resistance minimal area body contacts for state of the art FETs.

The present invention relates to a field effect transistor (FET) with an adjacent body contact, a SOI IC with circuits including the FETs and a method of fabricating the ICs. Device islands are formed in the silicon surface layer of a SOI wafer. Gates are defined on the wafer. Body contacts are formed in a perimeter conductive region adjacent to the gates. The body contacts may be either a silicide strap along the gate sidewall at one side of the FET or a separate contact separated from the gate by a dielectric stripe at one side of the FET. Separate contacts may be connected to a bias supply.

BRIEF DESCRIPTION OF THE DRAWINGS

The foregoing and other objects, aspects and advantages will be better understood from the following detailed description of a preferred embodiment of the invention with reference to the drawings, in which:

FIGS. 2A-B shows examples of forming body contacts on a first and second preferred Field Effect Transistor (FET) according to a preferred embodiment of the present invention;

DESCRIPTION OF PREFERRED EMBODIMENTS

Figure 1A:
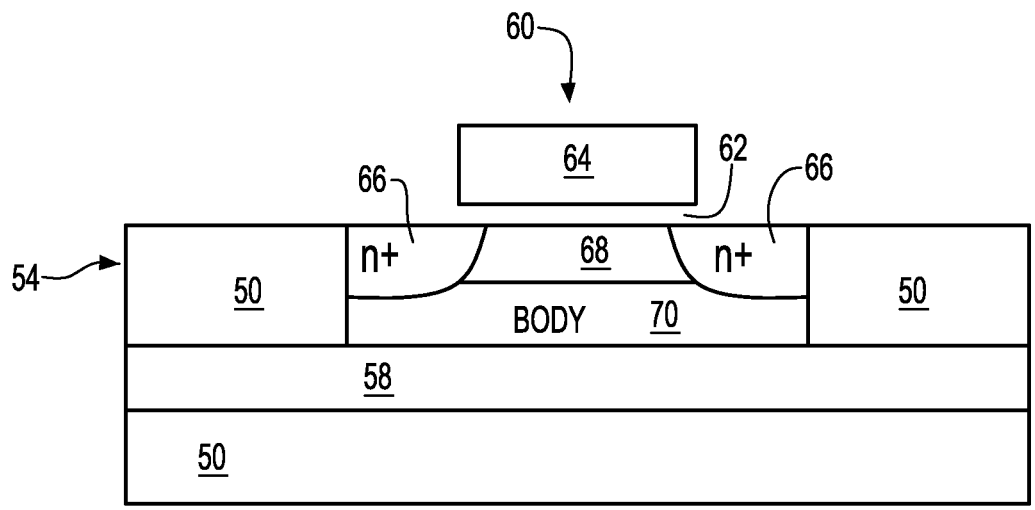
FIG. 1A shows a cross section of a prior art SOI wafer through a single FET that may be an NFET or a PFET.

Turning now to the drawings, and more particularly, FIGS. 2A-B show examples of a method 100, 100' of forming adjacent body contacts for a first and second preferred Field Effect Transistor (FET) according to the present invention. The body contact connects a bias to the FET, e.g., a bias voltage or a gate to body connection. Preferably, the biased body FETs are in Integrated Circuit (IC) chips formed on a Silicon on Insulator (SOI) wafer 102. In the first embodiment, preferred biased body FETs have the gate tied to the body by construction and so, are gate-biased body FETs. In the second embodiment, preferred biased body FETs have adjacent body contacts that may be wired to the gate, a source/drain diffusion or a bias voltage. Further, circuits including preferred biased body FET may be of the first embodiment, the second embodiment or a combination thereof or in further combination with typical floating body FETs. Furthermore, while described in terms of N-type FETs (NFETs), it is understood that P-type FETs (PFETs) may be formed substantially identically with appropriate substitution of P-type materials for N-type materials. Moreover, both preferred NFETs and preferred PFETs may be combined in circuits in the insulated gate complementary FET technology commonly referred to as CMOS.

So in step 104, device islands are defined in the surface layer of the SOI wafer in a state of the art photolithographic masking and etch step, e.g., in a typical Shallow Trench Isolation (STI) step. After filling the patterned wafer with STI dielectric, the wafer is planarized. In step 106 gate conductor lines are defined on the planarized wafer surface, e.g., depositing a layer of polysilicon and patterning photolithographically.

In step 108 of FIG. 2A perimeter stripes are formed along the perimeter of the device islands. The perimeter stripes cover the gate conductor lines at island perimeters. In step 110 gates are defined by trimming gate conductor lines which, for this gate-biased body FET embodiment, also exposes body contact areas. In step 112 silicide is formed on exposed wafer surfaces, including gate end sidewalls. The silicide formed on gate end sidewalls provides a gate to body strap that shorts the gate to the FET body in step 114. After forming gate-biased body FETs circuit/IC definition continues in step 116, wiring devices together into circuits and connecting circuits together and off chip through typical Back End Of the Line (BEOL) processing steps.

By contrast for the second embodiment formed in FIG. 2B, the step 110 of trimming gate conductor lines precedes the step 108 forming perimeter stripes. Thus in this second embodiment, the subsequently formed perimeter stripes cover the trimmed gate ends. So in step 112, when silicide is formed on exposed wafer surfaces, the gate end sidewalls are covered by perimeter stripes and silicide is prevented from forming on the gate ends. Thus in this embodiment, the gate remains isolated from the body contact and, as a result from the FET body. So, in step 118 contacts are formed to the FET bodies substantially coincident with source/drain contact formation. Since device bodies are separated from the gates by perimeter stripes, the body may be tied to the gate, a source/drain diffusion or a bias voltage. Finally in step 116, circuit definition continues through typical BEOL processing steps, substantially as described for the first embodiment.

Figure 3A:
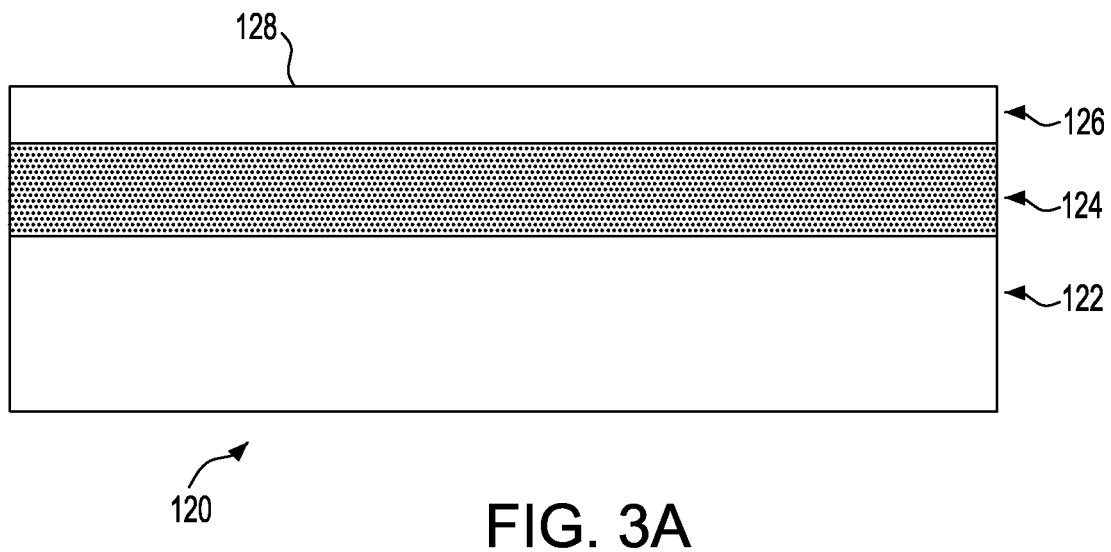
FIG. 3A shows a cross sectional example of an SOI wafer for forming gate-biased body FETs.

FIG. 3A shows a cross sectional example of an SOI wafer 120 for forming gate-biased body FETs according to a preferred embodiment of the present invention, e.g., in step 102 of FIGS. 2A-B. The SOI wafer 120 includes a bulk semiconductor (e.g., silicon) substrate 122 supporting a dielectric layer 124, e.g., Buried OXide (BOX), and a silicon surface layer 126. The surface silicon layer 126 is patterned in step 104, e.g., in a typical shallow trench isolation (STI) step. Preferably, oxide and nitride pad layers (not shown) are formed on the surface 128 and patterned. The patterned oxide and nitride pad layers form a mask that defines active area islands.

Figure 3B:
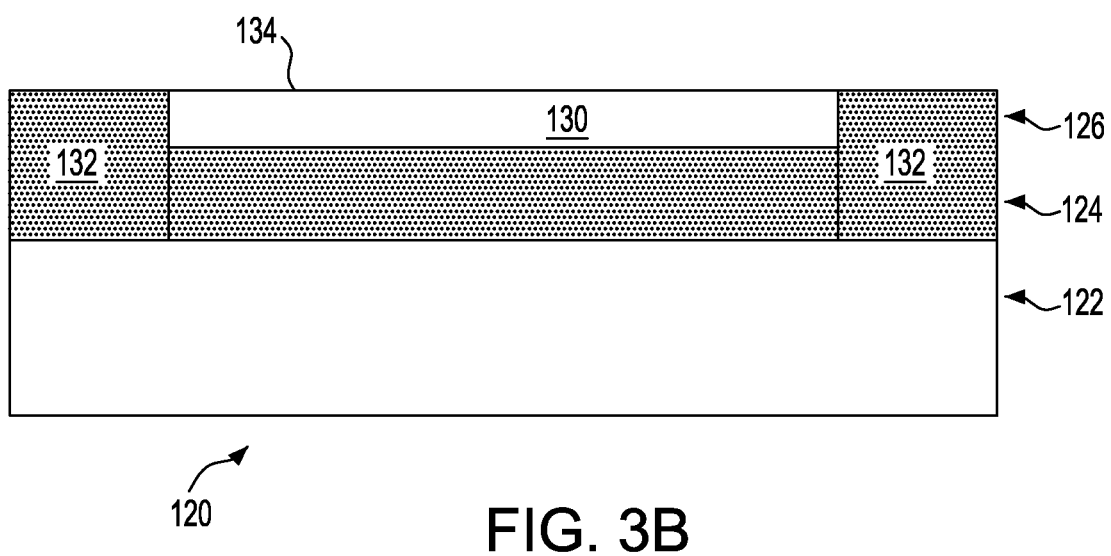
FIG. 3B shows active area islands etched through the surface layer to BOX layer, forming shallow trenches that define the active area islands.

FIG. 3B shows a cross sectional example of active area islands formed in step 104 of FIGS. 2A-B. The active area islands are etched through the surface layer 126 to BOX layer 124, forming shallow trenches 130 that define the active area islands 132. Next, the patterned oxide and nitride pad layers may be removed. Then, shallow trenches between the active area islands are filled with dielectric, e.g., $SiO_2$, and the wafer 120 is planarized. Preferably, the trenches 130 are filled with oxide before planarizing and the patterned oxide and nitride pad layers are removed when the trench oxide is planarized, e.g., in a typical chemical-mechanical (chem-mech) polish (CMP) step. Once the wafer is planarized, the islands may be body doped N-type or P-type in a typical FET body doping step, with a suitable dopant and concentration for a particular device type.

Figure 4A:
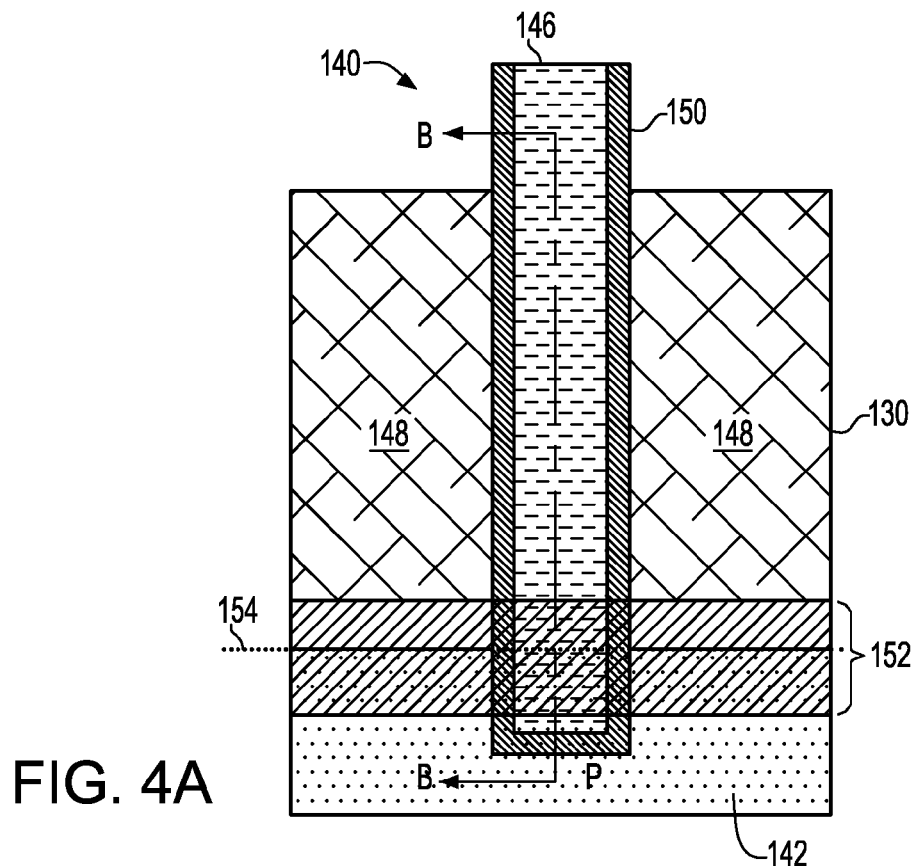
FIGS. 4A-B show an example of a partially formed gate-biased body FET on a portion of a silicon island.
Figure 4B:
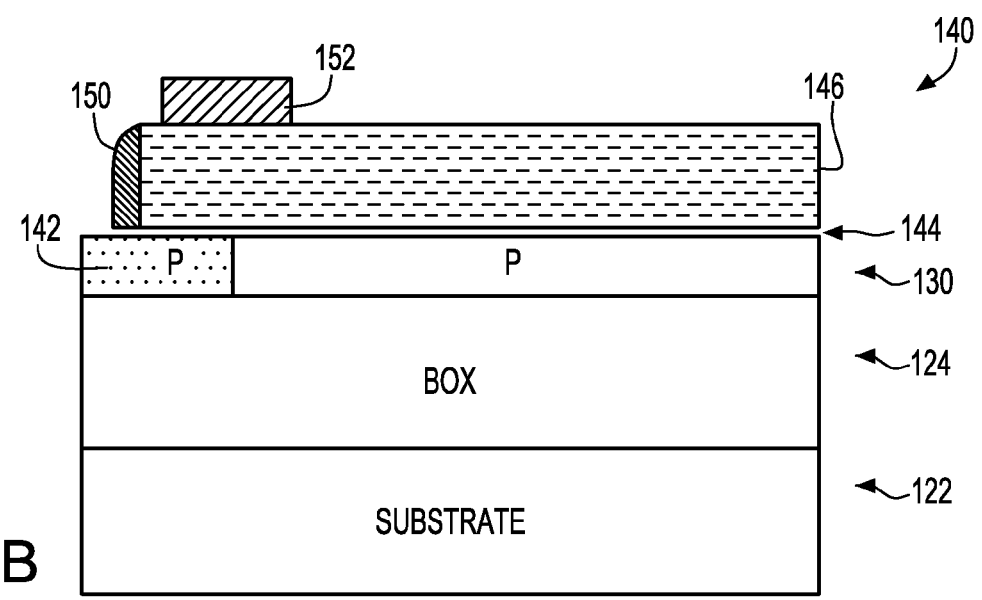

Next in step 106 (of FIG. 2A) gate conductor lines are formed as shown in the plan view example of FIG. 4A of a partially formed gate-biased body FET 140. FIG. 4B shows a cross-section through B-B. The partially formed gate-biased body FET 140 is formed on a portion of a silicon island (e.g., 130 in FIGS. 3A-B) after further defining body contact areas 142, e.g., masking and doping in a standard body contact area doping implant step. A gate dielectric layer 144 is formed on the wafer surface and a gate layer (e.g., polysilicon) is formed on the gate dielectric layer 144. The gate layer is patterned (e.g., in typical photolithographic patterning step) to define gate conductor lines 146. Next source/drain extension regions 148 are formed in a typical source/drain extension and halo implant step, forming source/drain extension regions 148 on either end of the gate conductor lines 146, i.e., on opposite sides of the line. Similarly, P-type source/drain extension regions are formed with a typical source/drain extension and halo implant step for PFETs (not shown) that also dopes the body contact areas 142. After implanting source/drain extension regions 148, a conformal spacer layer (e.g., nitride) is formed on the wafer surface. The spacer layer is anisotropically etched such that standard nitride sidewall spacers 150 remain along gate sidewalls, lining the perimeter of the gate conductor lines 146.

Next, in step 108 of FIG. 2A, perimeter stripe layer is conformally deposited and patterned to leave a perimeter dielectric stripe 152 that overlaps both the body contact areas 142 and the source/drain extension regions 148 at dotted line 154. Preferably, the perimeter stripe layer (and resulting perimeter stripe 152) is a 30-40 nm thick dielectric (nitride) layer, thick enough to block substantially all of the subsequently implanted heavy source/drain diffusions.

Figure 5A:
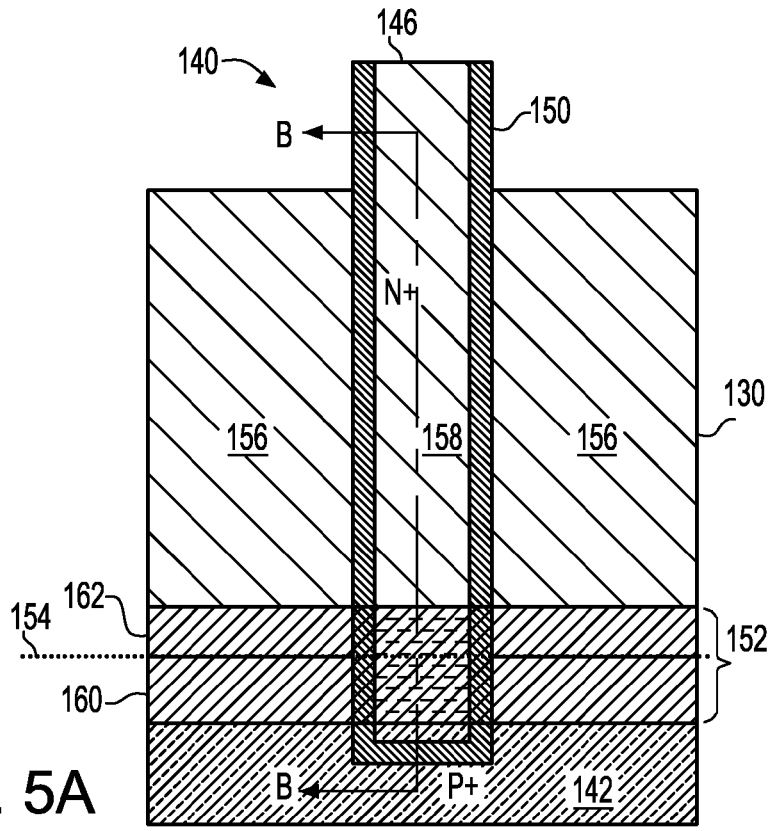
FIGS. 5A-B show an example of implanting source/drain diffusions for a preferred gate-biased body FET.
Figure 5B:
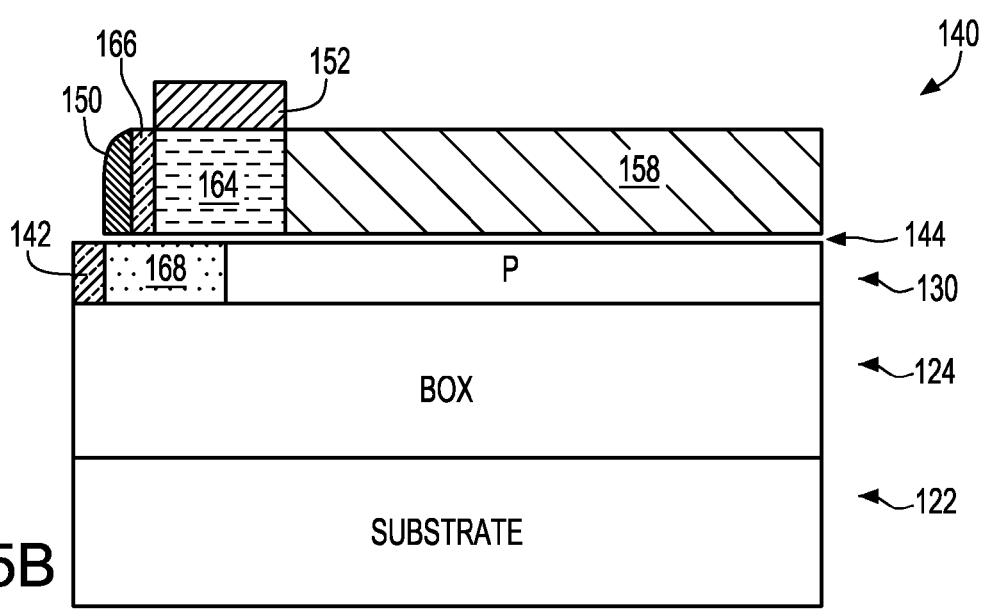

FIGS. 5A-B show a plan view and cross sectional (through B-B) example of a preferred gate-biased body FET 140 with doped source/drain diffusions 156. Since in this example the gate-biased body FET 140 is an NFET, source/drain diffusions 156 are doped N-type and body contact areas 142 are doped P-type before the gates are trimmed. In typical state of the art CMOS definition steps, a blocking mask blocks one type of dopant when doping source/drain regions of the other type. Also, the gate 158 is normally doped with the source/drain diffusions 156. For a preferred gate-biased body FET 140, the body contact area 142 is doped with the same dopant as the body, i.e., P-type for an NFET and N-type for a PFET. So normally, a P-type blocking mask (e.g., a BP mask) blocks implanting NFETs when doping PFET gates and source/drain regions (but implants NFET body contact areas 142 with P+ dopant); and, correspondingly, an N-type blocking mask (e.g., a BN mask) blocks N-type dopant from implanting PFET gates and source/drain regions when doping NFET gates and source/drain regions (but implants PFET body contact areas with N+ dopant). PFET source/drain doping may follow NFET source/drain doping or vice versa.

As noted, exposed portions 158 of gate conductor lines 146 are doped with the NFET source/drains 156. During this source/drain implant, however, the perimeter dielectric stripe 152 and the gate conductor lines 146 mask a portion of the body contact area 142. Further the perimeter stripe 152 blocks most of the heavy dopant both from the shared boundary 154 of source/drain diffusions 156 and the body contact area 142. Thus, the perimeter stripe 152 defines a PN stripe of moderately doped N 160 and P 162 along this boundary 154. These more lightly doped PN stripes 160, 162 support a wider depletion region at the PN junction (shared boundary 154) and reduce N+ to P+ diffusion capacitance, i.e., source/drain diffusion 156 to body contact capacitance. The perimeter stripe 152 also blocks dopant from a portion 164 of the gate conductor lines 146, which in this example also includes a small P-doped temporary portion 166.

Figure 6A:
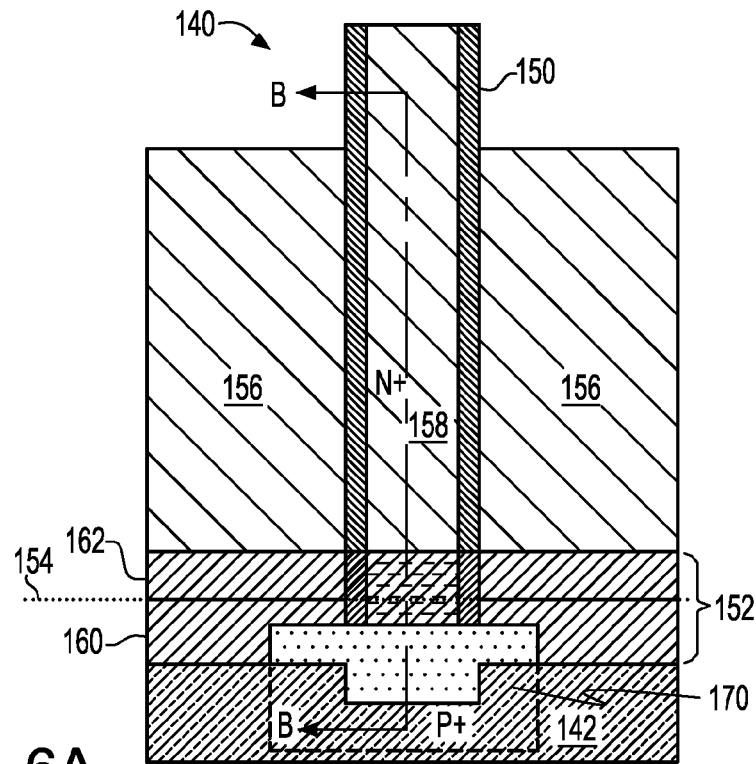
FIGS. 6A-B show an example of gate trimming to expose contact region for a preferred gate-biased body FET.
Figure 6B:
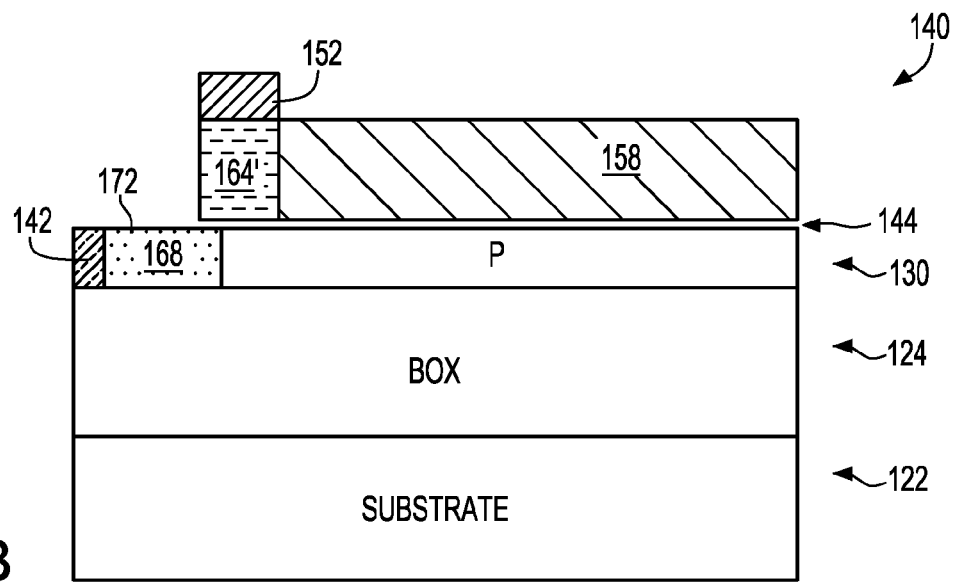

In particular, the perimeter stripe 152 and gate area portion 164 mask adjacent body contact region 168 from heavy P-type doping, that is exposed when gate conductors are trimmed in step 110 of FIG. 2A, as shown in the example FIGS. 6A-B, which show a plan view and cross sectional (through B-B). As a result, the heavily doped $P^+$ or $N^+$ perimeter conductive region 142 ($P^+$ in this example) is separated from the $N^+$ or $P^+$ source/drain regions 156 ($N^+$ in this example) by the body doped PN stripe 160, 162 and in particular by the PN junction 154. Also, the perimeter stripe 152 extends along the $P^+$ perimeter conductive region 142 and above the body doped PN stripe 160, 162.

Gate trimming step 110 has become standard for 45 nm CMOS technology to avoid gate foreshortening what would otherwise occur with a single-step gate definition. A gate trimming mask (not shown) is formed on the wafer with openings 170 at the ends of the gate conductor lines, 146 in FIGS. 5A-B. The openings 170 expose the gate conductor line ends and a portion of the perimeter stripe 152 for removal with a suitable etchant. The etchant etches both polysilicon (in this example, both a section of gate area portion 164 and small P-doped temporary portion 166) to masked gate area 164' and exposed nitride (both sidewall nitride 150 and exposed perimeter stripe 152) selective to oxide. This defines the gate conductors 158' and re-exposes gate oxide on the surface 172 of contact region 168. The gate oxide, which remains unetched, protects the exposed silicon surface 172.

Figure 7A:
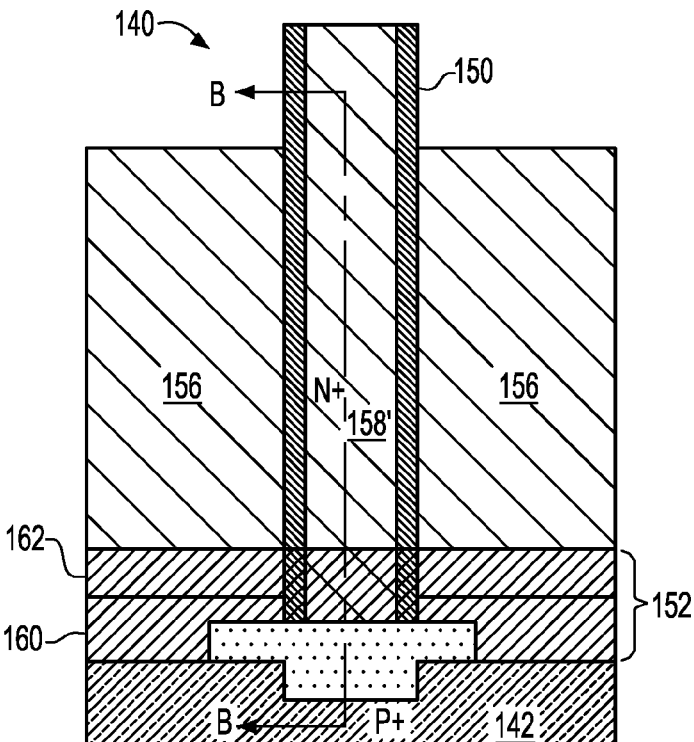
FIGS. 7A-B show an example after annealing in a standard source-drain diffusion activation anneal for a preferred gate-biased body FET.
Figure 7B:
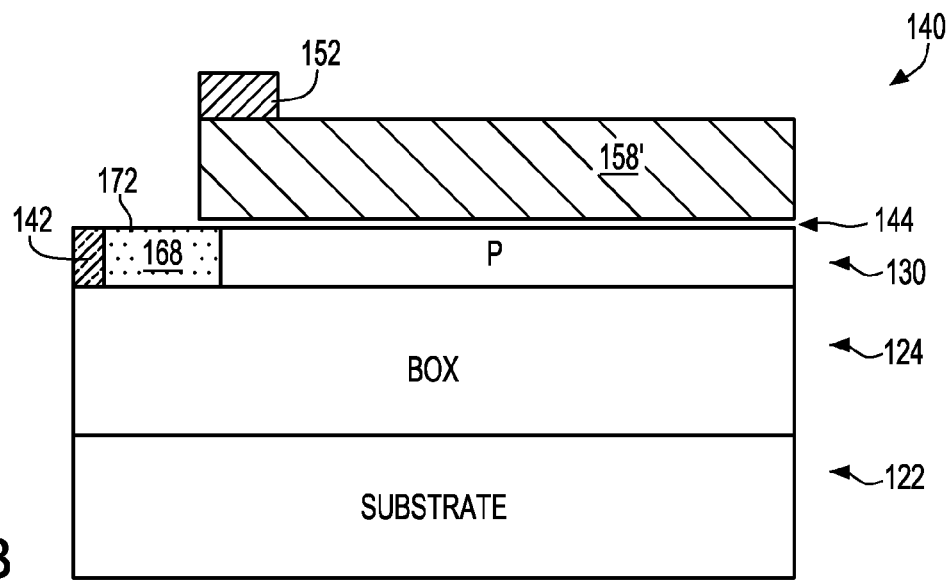

FIGS. 7A-B show a plan view and cross sectional (through B-B) example after a standard source-drain diffusion activation anneal. In a standard CMOS process, N+ dopant diffuses by more than 100 nm in polysilicon. So, because of this high diffusivity of polysilicon, the dopant rapidly diffuses throughout the gate conductor 158' including the masked gate area 164'.

Figure 8A:
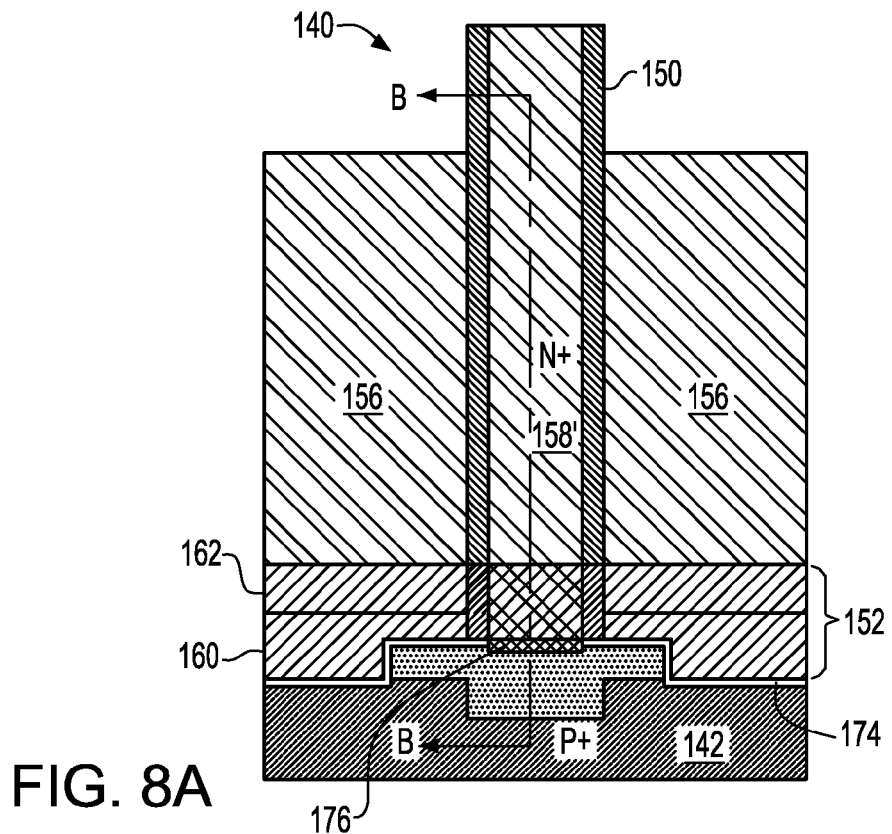
FIGS. 8A-B show an example of a completed preferred embodiment gate-biased body FET.
Figure 8B:
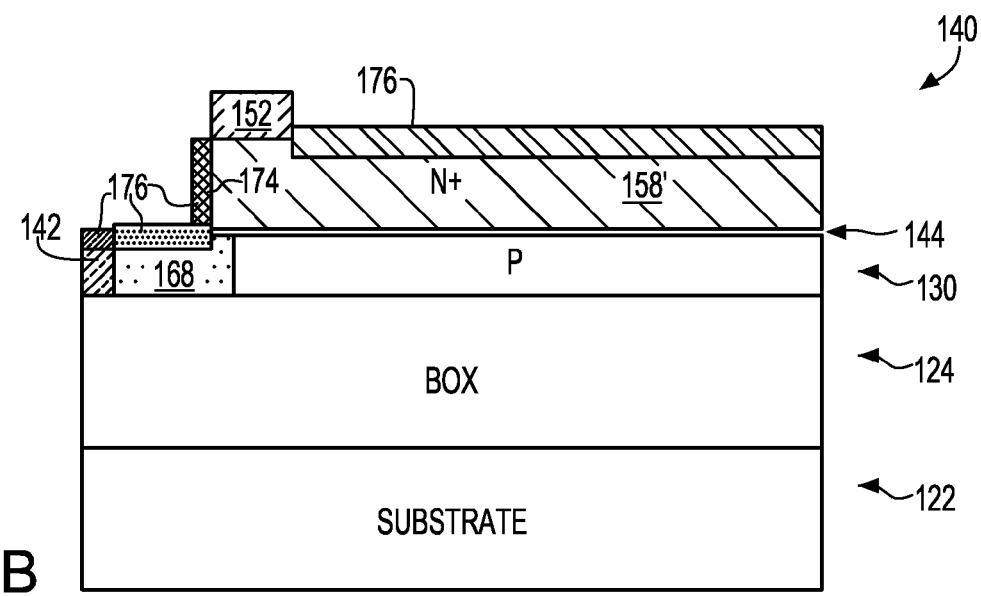

Silicide is formed on exposed silicon surfaces in step 112 of FIG. 2A, as shown in the example of FIGS. 8A-B, which show a plan view of preferred embodiment gate-biased body FET 140 and cross sectional view through B-B. After annealing to diffuse dopant, low resistance silicide is formed on all exposed silicon surfaces in a standard silicidation, i.e., to form silicide on the source-drain diffusions and gate conductors. First, gate oxide that is exposed by trimming the gate ends and/or that may have otherwise formed on exposed silicon and polysilicon, e.g., during the anneal, is removed with, for example, a suitable fluorine wet or dry etch. Once all oxide is stripped from silicon surfaces, a thin metal layer, such as nickel, cobalt, tungsten, or titanium, is deposited onto all exposed silicon surfaces and annealed. During the anneal, the metal reacts with the exposed silicon, including the exposed gate sidewall 174. The metal reacting with the silicon forms a surface silicide layer 176 on all exposed surfaces.

The perimeter stripe 152 blocks silicidation with underlying silicon surfaces to maintain a separation between and, avoid shorting between, P+ and N+ regions, the body contact area 142 and source/drain diffusions 156, respectively. Thus, advantageously, the perimeter stripe 152 maintains separation of silicide in these regions 142, 156, instead of relying on an enlarged gate conductor as in the prior art. The minimal separation of the perimeter stripe 152 provides greatly reduced (over prior art approaches) gate to diffusion capacitance.

Further, silicide formation completes the gate to body contacts in step 114 of FIG. 2A to form a low-capacitance gate to body tie. Silicide that forms on the gate sidewall 174 shorts the gate to adjacent silicided surface 172 of the P+ contact region 168, shorting the N-type gate 158' to the P-type body contact 168 of the NFET 140. In particular, this sidewall silicide easily forms a continuous layer that reliably bridges between the polysilicon sidewall 174 and the body contact region 168 of silicon surface layer 130.

Once body contacts are formed, circuit/IC definition continues in step 116 of FIG. 2A. Contacts (not shown) are formed normally to gates 158' and source/drain regions 156 of gate-biased body FETs 140. In typical state of the art BEOL processing steps, wires (also not shown) are formed between the contacts, wiring devices together into circuits and connecting circuits together and off chip.

In a second preferred embodiment contacts are formed to the body as described with reference to FIG. 2B, substantially with forming contacts to source/drain diffusions (e.g., 156 in FIGS. 4A-8B). Formation of this second preferred embodiment proceeds in steps 102 and 104 substantially as shown in FIGS. 3A-B, defining device islands substantially identically to the first preferred embodiment.

Figure 9A:
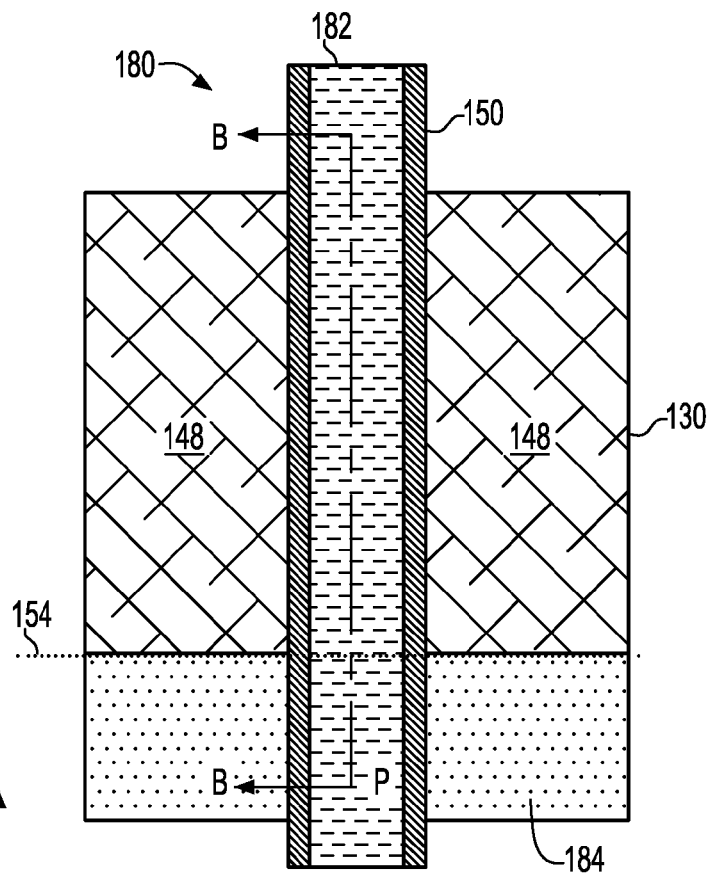
FIGS. 9A-B show an example of a partially formed FET with an external body contact, formed on a portion of a silicon island according to a preferred embodiment of the present invention.
Figure 9B:
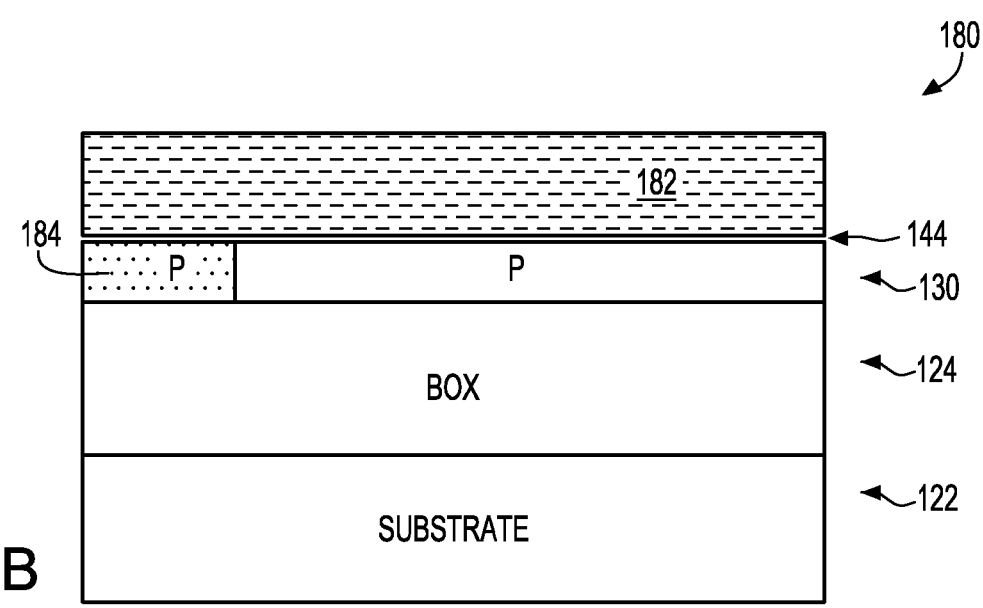

Once device islands have been defined in step 104, gate conductor lines are formed on a portion of a silicon island 130 for the second preferred embodiment FET 180 as shown in FIGS. 9A-B (which shows a plan view example and a cross-section through B-B). This second preferred embodiment FET 180 is formed substantially as described for the first preferred FET 140. So, this step 104 proceeds substantially as described for FIGS. 4A and B with like features labeled identically. It should be noted that in this example, the gate conductor lines 182 do not terminate on the body contact areas 142. However, as with the first preferred embodiment, source/drain extension regions 148 are formed on either side of the gate conductor lines 182 and standard nitride sidewall spacers 150 are formed along the gate conductor lines 182. Similarly, P-type drain extension regions are formed with a typical source/drain extension and halo implant step for PFETs (not shown) that also dopes the body contact areas 142.

Figure 10A:
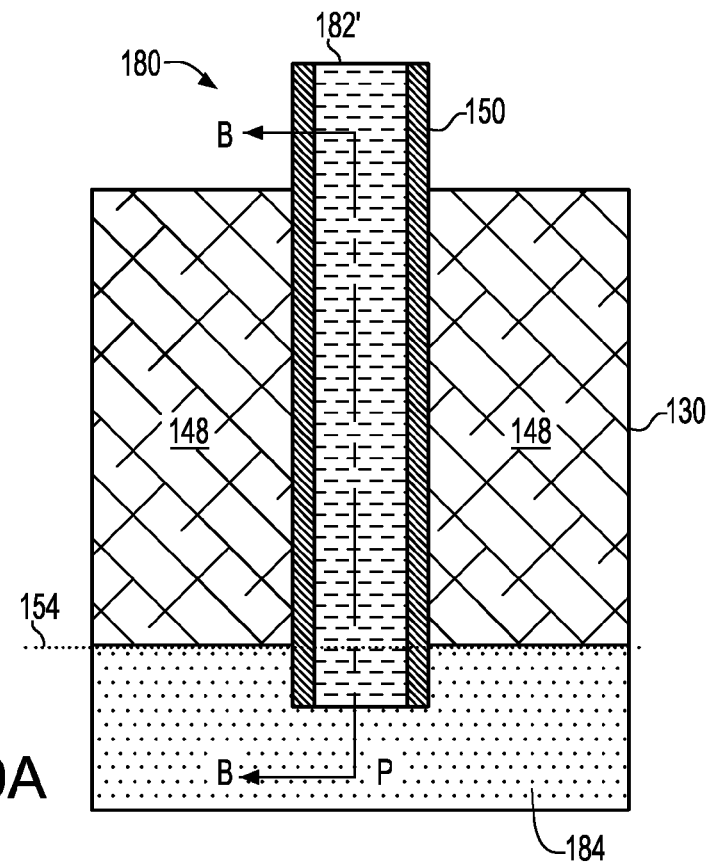
FIGS. 10A-B show an example of gate trimming which precedes perimeter stripe formation in forming the external body contact.
Figure 10B:
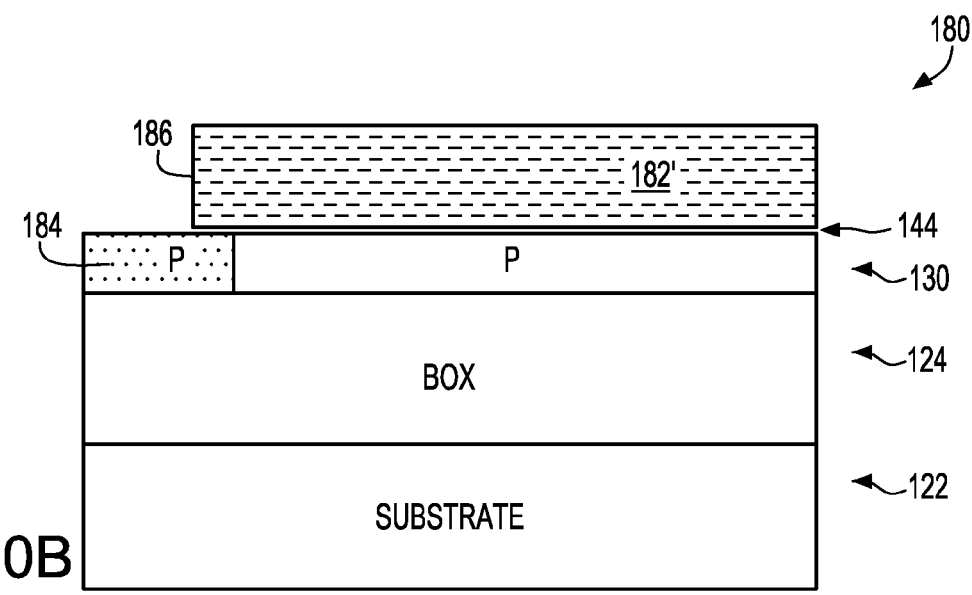
Figure 11A:
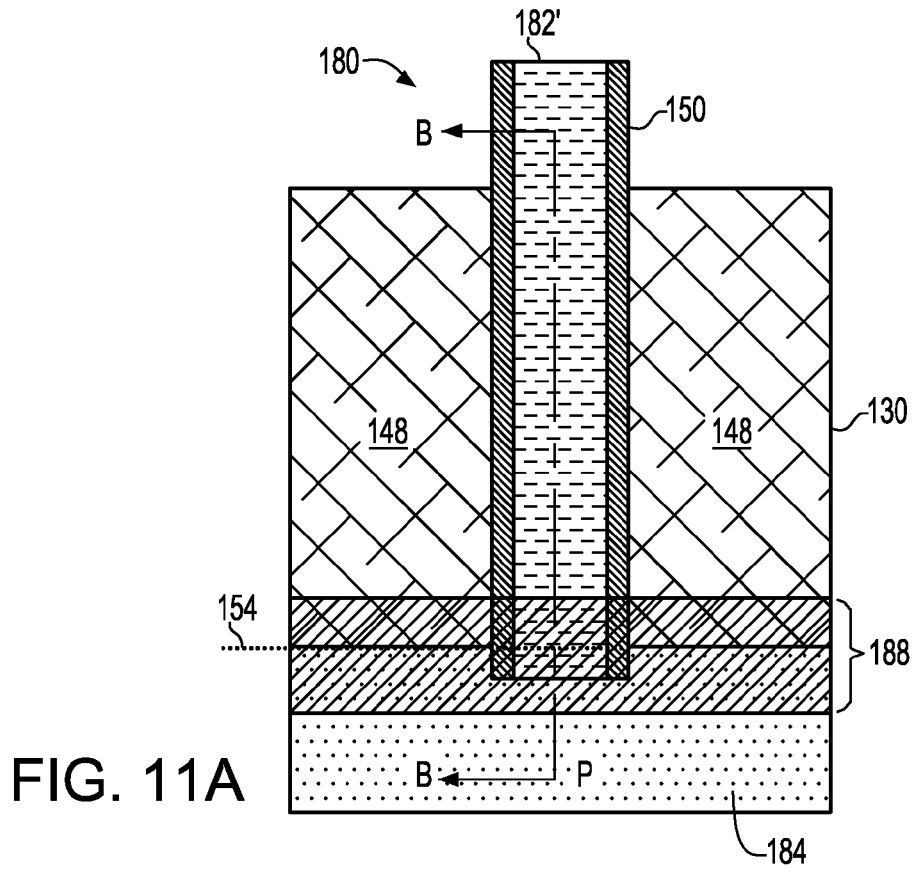
FIGS. 11A-B show an example of forming the perimeter stripe after trimming the gate conductor.
Figure 11B:
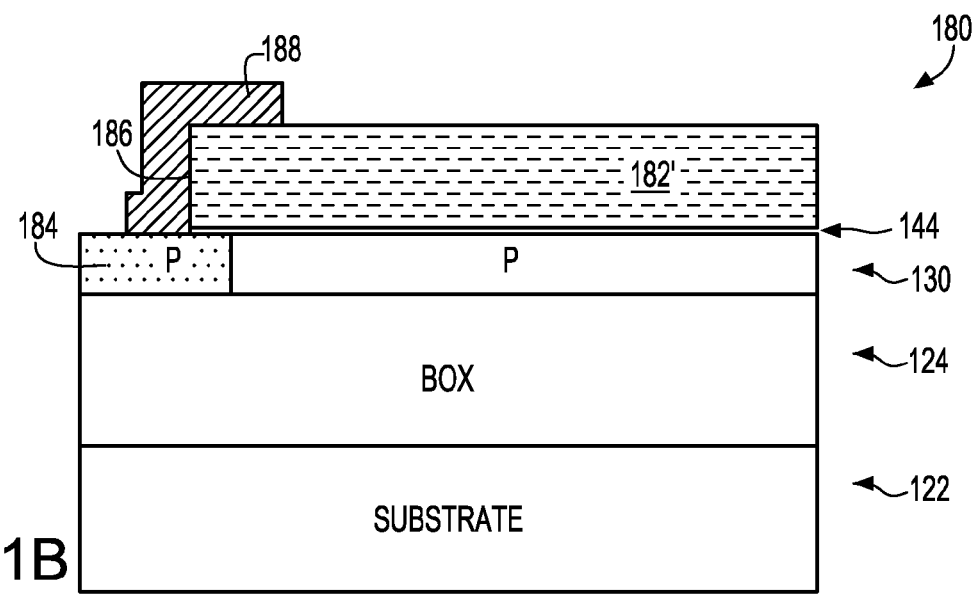

As shown in FIG. 2B and noted hereinabove, the gate trimming step 110 shown for this embodiment in FIGS. 10A-B (a plan view and cross-section through B-B) precedes perimeter stripe formation. Once trimmed, the end 186 of the gate conductor 182' is exposed and terminates over the body contact areas 142.

Figure 1B:
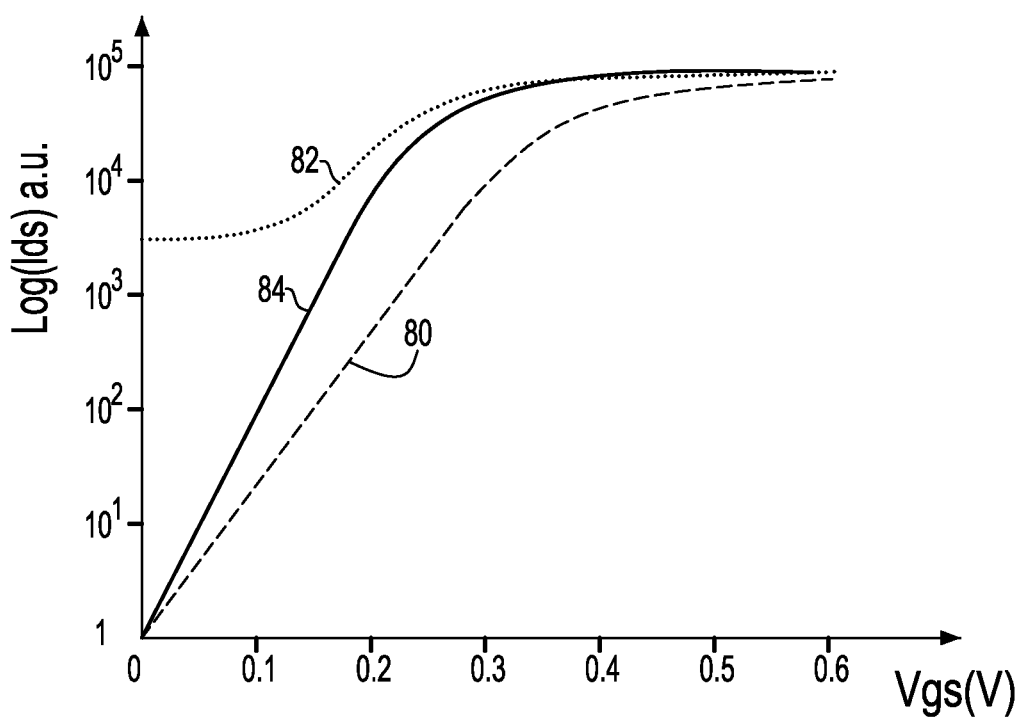
FIG. 1B shows an example of the effect of body bias on the I-V curve for a typical state of the art NFET.

The perimeter stripe formation 108 shown in FIGS. 1A-B (a plan view and cross-section through B-B), forms the perimeter stripe 188 above the trimmed gate conductor 182'. Preferably, the perimeter stripe 188 is formed by conformally depositing a layer of suitable material (e.g., nitride) on the wafer and patterning to leave a perimeter stripe 188 of dielectric material that overlaps both the body contact areas 142 and the source/drain extension regions 148 at dotted line 154. Moreover, the perimeter stripe 188 overlaps the trimmed end 186 of the gate conductor 182'. Again, preferably, the conformally deposited dielectric layer (and resulting perimeter dielectric stripe 188) is a 30-40 nm thick nitride layer, thick enough to block substantially all of the subsequently implanted heavy source/drain diffusion dopant.

Figure 12A:
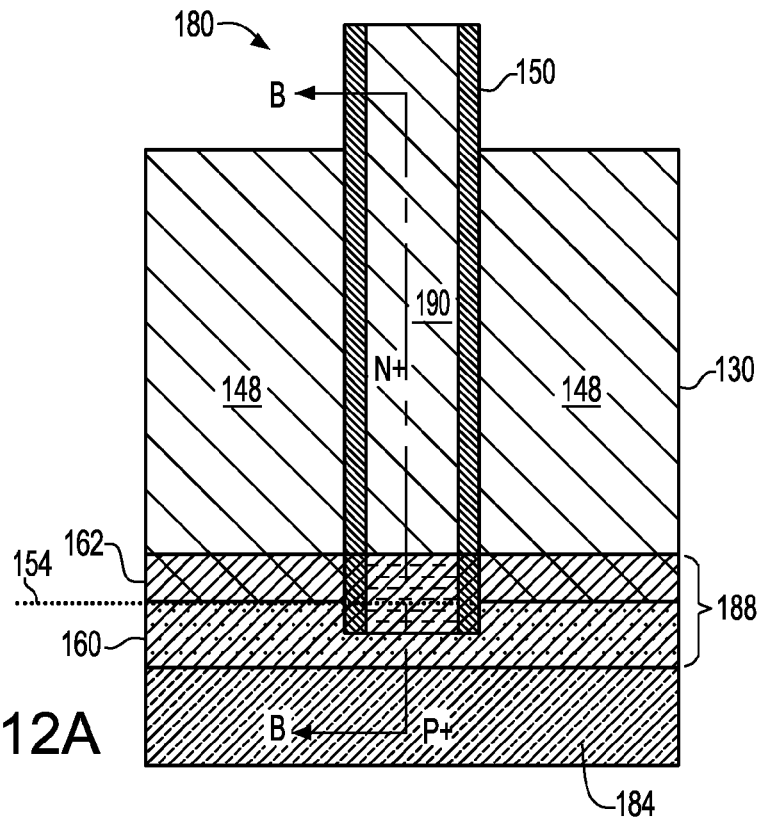
FIGS. 12A-B show an example of the FET with an external body contact after implanting source/drain diffusions.
Figure 12B:
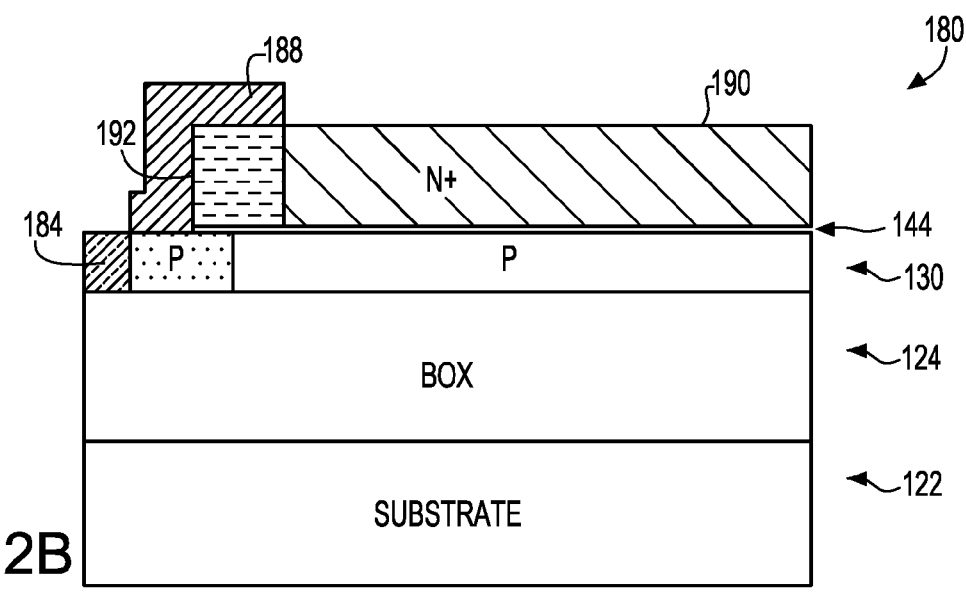

FIGS. 12A-B show (a plan view and cross sectional through B-B, respectively) an example of a partially formed second preferred FET 180 after implanting source/drain diffusions 156, substantially as described for FIGS. 5A and B with like features labeled identically. Again, a P-type blocking mask (e.g., a BP mask) blocks implanting NFETs (except for body NFET contact areas 142) when doping PFET gates and source/drain regions; and, correspondingly, an N-type blocking mask (e.g., a BN mask) blocks N-type dopant from implanting PFETs (except for body PFET contact areas) when doping NFET gates and source/drain regions. PFET source/drain doping may follow NFET source/drain doping or vice versa. Also, the body contact area 184 is doped with the same dopant as the body, i.e., P-type for an NFET and N-type for a PFET. Exposed portions 190 of gate conductor lines are doped with the NFET source/drains 156. Further the perimeter stripe 188 blocks most of the heavy dopant that originates from implanting both source/drain diffusions 156 and the body contact area 184, leaving a PN stripe of moderately doped N 160 and P 162. Again, these more lightly doped stripes 160, 162 support a wider depletion region and reduce N+ to P+ diffusion capacitance, i.e., source/drain diffusion 156 to body contact capacitance.

Figure 13A:
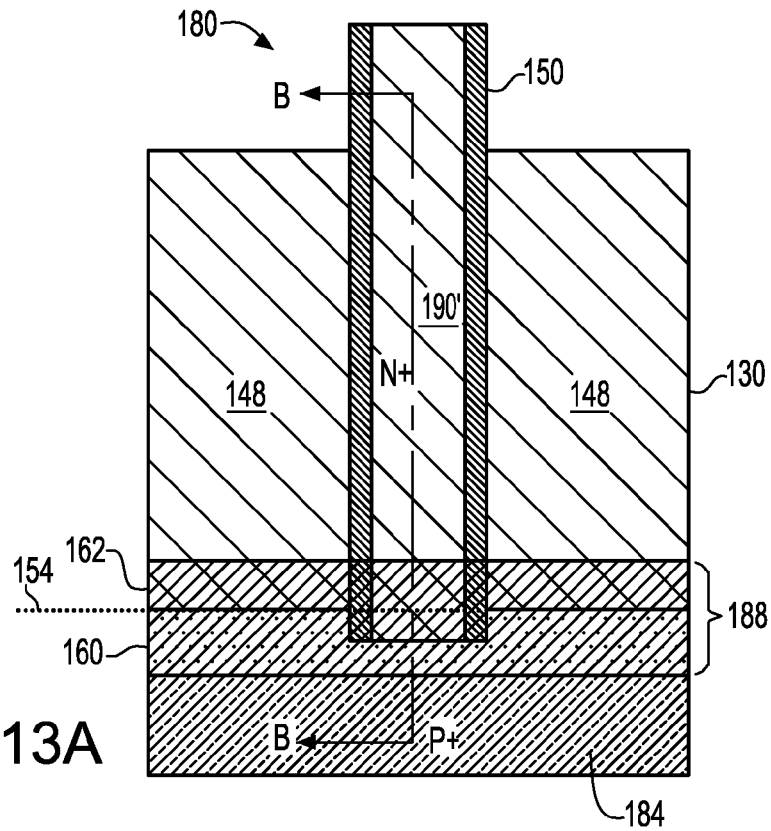
FIGS. 13A-B show an example of a standard source-drain diffusion anneal to activate dopant in the FET.
Figure 13B:
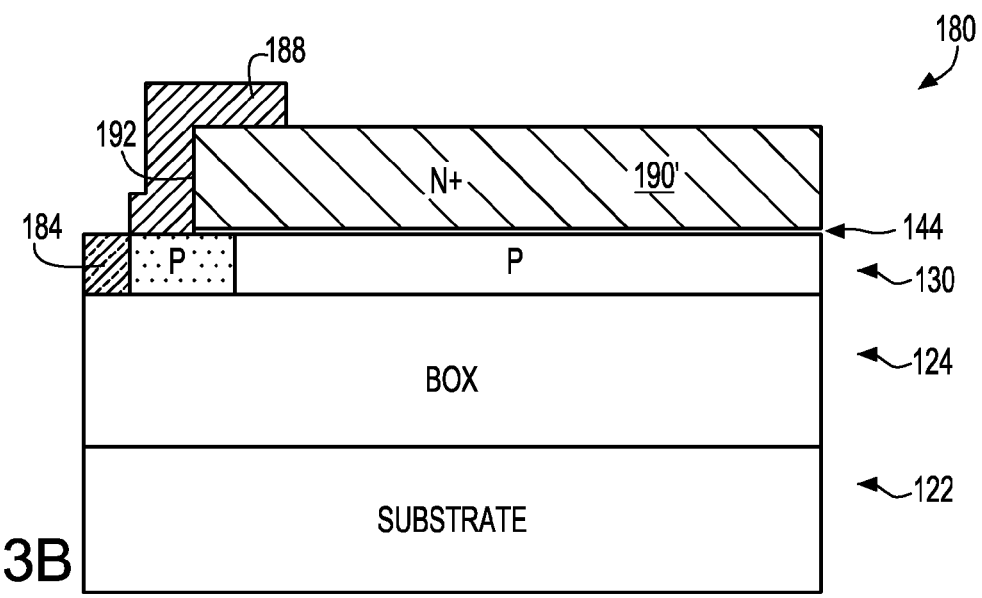

As shown in the example of FIGS. 13A-B (a plan view and cross sectional through B-B, respectively) a standard source-drain diffusion anneal activates dopant in the device regions substantially as shown in FIGS. 7A-B for the first preferred embodiment with like features labeled identically. In particular, as a result of annealing, the entire gate 190' is doped with the respective dopant. In this embodiment, however, the perimeter stripe 188 covers the entire gate end 192 to block formation of silicide there.

Figure 14A:
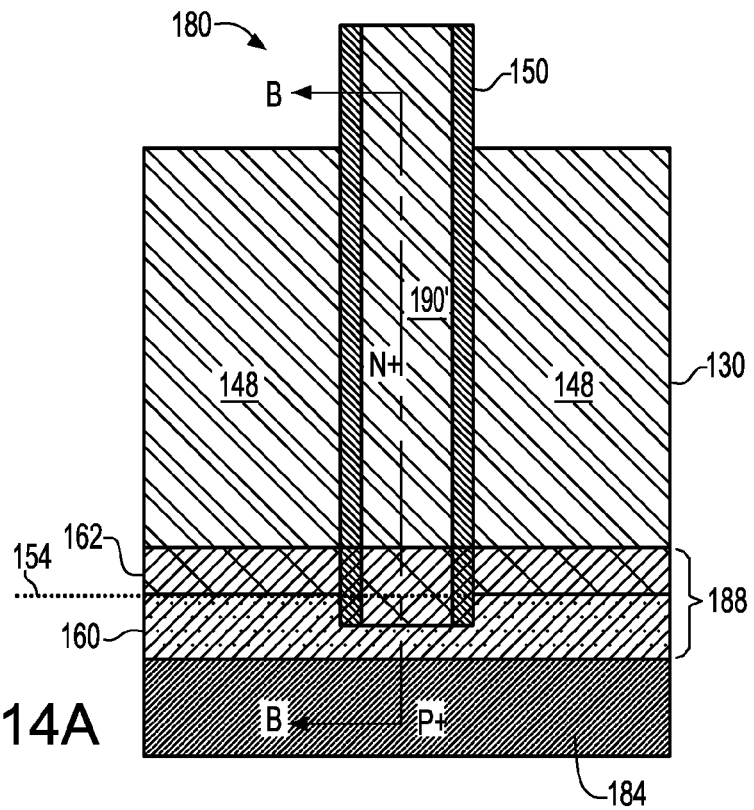
FIGS. 14A-B show an example of low resistance silicide formed on all exposed silicon surfaces of the FET.
Figure 14B:
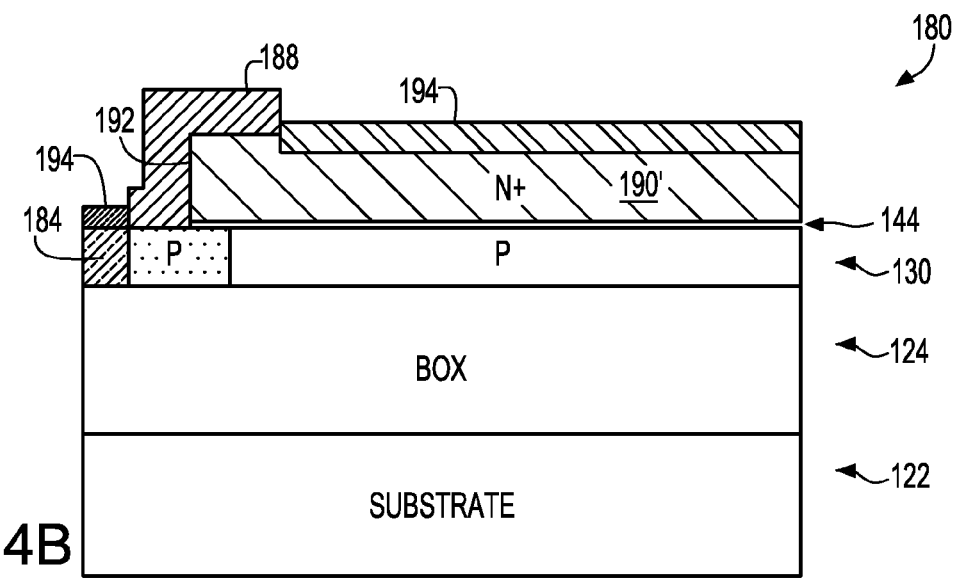

So after annealing to diffuse dopant, in step 112 of FIG. 2B low resistance silicide is formed on all exposed silicon surfaces as shown in the example of FIGS. 14A-B (a plan view and cross sectional through B-B, respectively). Preferably, the 2B low resistance silicide 194 forms on the source-drain diffusions and on the gate 190' in a standard silicidation step. First, silicon and polysilicon surfaces are cleaned to remove any oxide that may have formed, e.g., during the anneal, with, for example, a suitable fluorine wet or dry etch. Then, a thin metal layer, such as nickel, cobalt, tungsten, or titanium, is deposited onto all exposed silicon surfaces and annealed. Again, the metal reacts with the exposed silicon and polysilicon during the anneal to form surface silicide layer 194. The perimeter stripe 188 blocks silicidation with underlying silicon surfaces, including gate ends 192 to maintain a separation and avoid shorting between P+ and N+ regions, the body contact area 184 and source/drain diffusions 148, respectively. As noted hereinabove with respect to in this embodiment, the gate 190' remains isolated from the body contact and, as a result from the FET body.

Figure 15A:
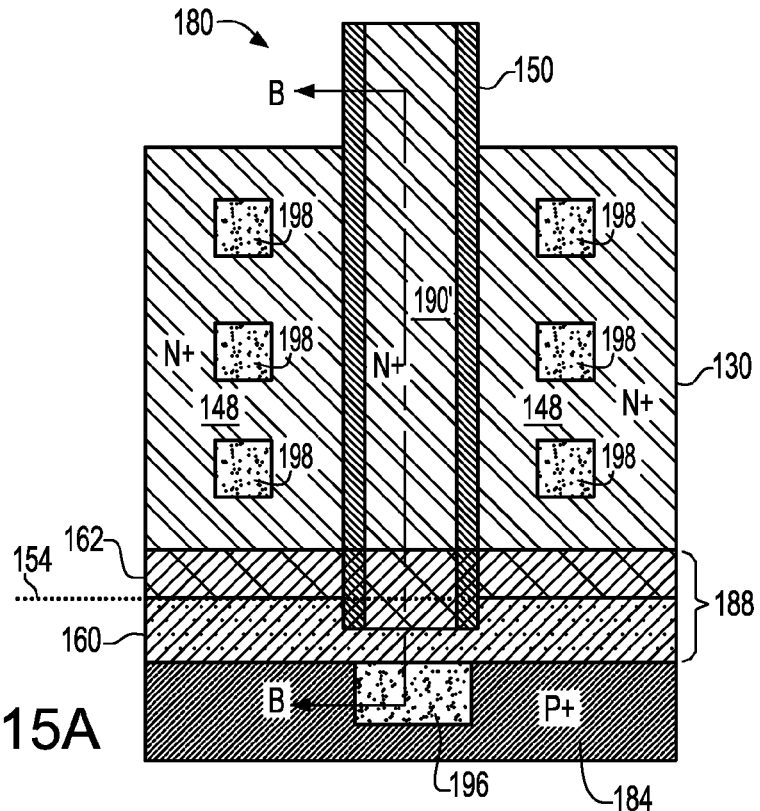
FIGS. 15A-B an example of external body contacts formed coincident with FET source/drain contacts.
Figure 15B:
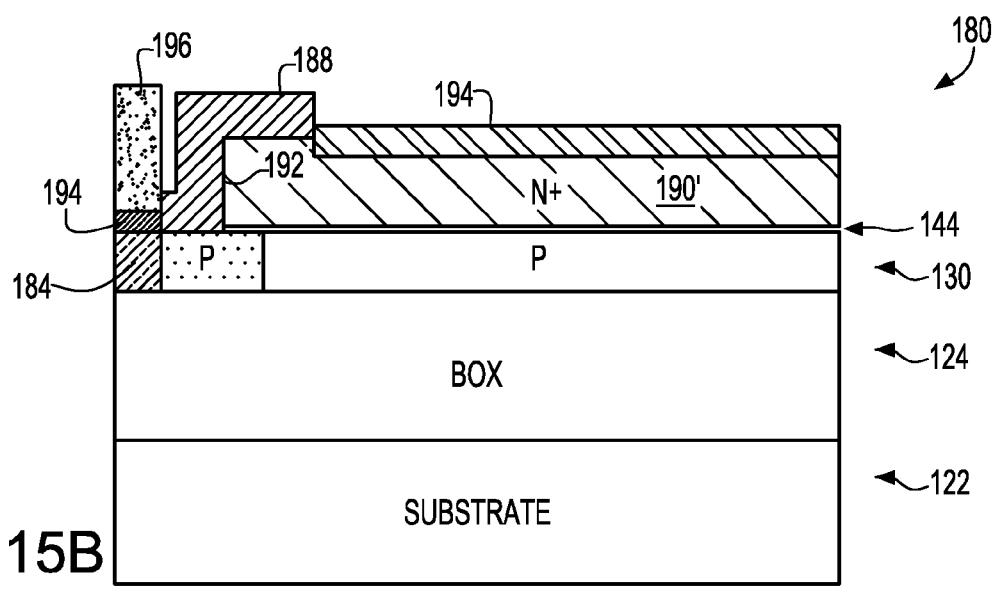

So, in step 118 of FIG. 2B contacts are formed to the FET bodies 196, coincident with or separate from source/drain contact 198 formation, as shown in the example of FIGS. 15A-B, which shows a plan view and cross sectional through B-B, respectively. Preferably, for minimized body contact area, the body contacts 196 are formed separately from the source-drain contacts 198 in separate masking and etching steps. Separating contact formation steps allows optimizing each step for each particular type of contact. So, for example, the etchant used for etching vias for body contacts 196 may be selective to silicon nitride, which allows making these contacts borderless with respect to the gate conductor.

Since device bodies are separated from the gates 190' by perimeter stripes 188, the body may be tied (at contact area 184) to the gate, a source/drain diffusion or a bias voltage. Contact 196, 198 formation may entail, for example, depositing and planarizing a layer of oxide in a typical chemical vapor deposition (CVD) step. A contact mask pattern is formed on the CVD oxide, and contact vias are etched through the CVD oxide to the underlying the body contact area 184 and source/drain diffusions 156. Then, in a typical through-via or contact step, a suitable conductive material such as metal (e.g. tungsten with appropriate liners) or polysilicon is deposited to filling the vias. By virtue of the presence of the perimeter stripe 188, the body contacts 196 are borderless. In particular, the contact 196 opening can overlap the perimeter stripe 188. Because the body contacts 196 are borderless, the P+ (in this example) body contact 196 has an area that is much smaller than would otherwise be necessary.

Once body contacts are formed, circuit/IC definition continues in step 116 of FIG. 2B. Gate contacts (not shown) are formed normally to gates 190'. In typical state of the art BEOL processing steps, wires (also not shown) are formed between the contacts, wiring devices together into circuits and connecting circuits together and off chip, substantially as described for the first embodiment.

Figure 16:
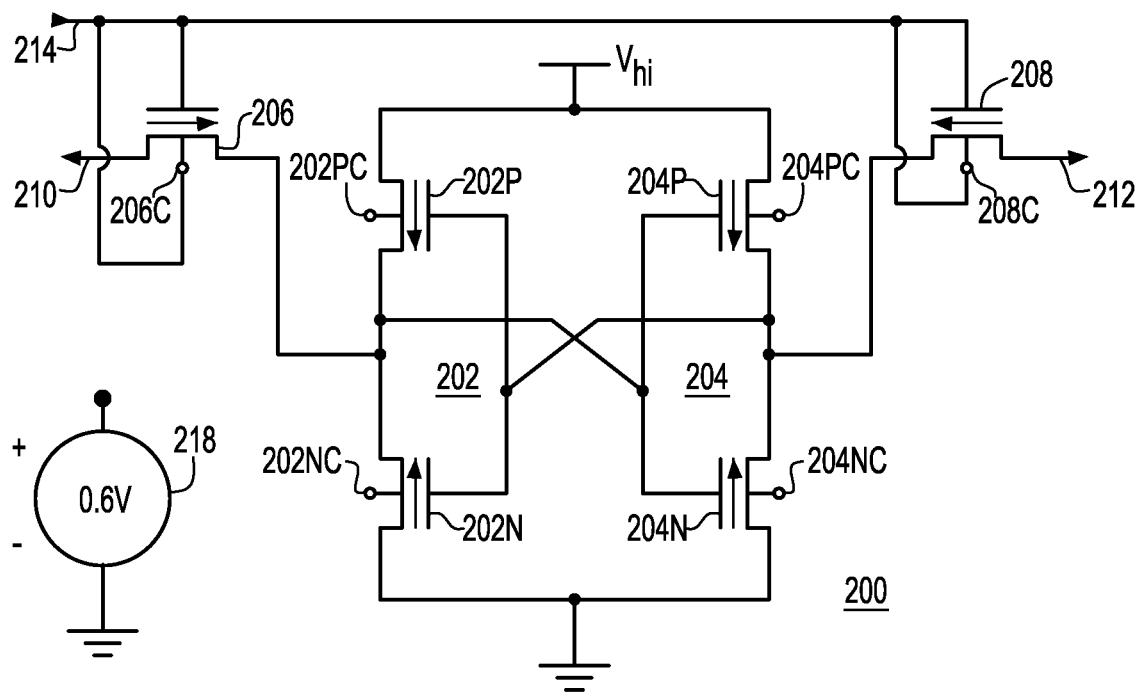
FIG. 16 is a schematic of a typical CMOS Static RAM (SRAM) cell of preferred FETs, e.g., in a SRAM array of SRAM cells embedded in logic or in a stand-alone SRAM chip.

FIG. 16 is a schematic of a typical CMOS Static RAM (SRAM) cell 200 of preferred FETs 140 and/or 180 of FIGS. 3A-15B, e.g., in a SRAM array of SRAM cells 200 embedded in logic or in a stand-alone SRAM chip. Each cell 200 is, essentially, an identical pair of cross-coupled CMOS inverters 202, 204 and a pair of pass transistors 206, 208 between the cross-coupled inverters 202, 204 and a pair of bit lines 210, 212. A word line 214 is tied to the gate of pass transistors 206, 208. Each CMOS inverter 202, 204 is, simply, an NFET 202N, 204N and a PFET 202P, 204P. The gate and drain of each PFET 202P, 204P is tied to the gate and drain of corresponding NFET 202N, 204N, respectively. The source of the PFETs 202P, 204P are connected to supply voltage ($V_{hi}$) and the source of the NFETs 202N, 204N are connected to GND. The channel body for each FET 202N, 202P, 204N, 204P, 206 and 208 is represented by node 202NC, 202PC, 204NC, 204PC, 206C and 208C, respectively. The state of the cross-coupled inverter pair 202, 204 determines the state of data stored in the cell 200. The devices may be tied gate to body as with pass gate NFETs 206, 208, to ground, to the supply or to a bias supply, e.g., 218.

Advantageously, the nitride stripe separates body contact regions from active device region and blocks silicidation to avoid shorting across the junction between the diffusions (N+ in this example) to device bodies without resorting to large, prior art T-shaped gate conductors. The nitride stripe, which normally is included for blocking polysilicon resistor silicidation, provides sufficient separation to obviate the need for T-shaped gate conductor and, as a result, to avoid the attendant gate to body and gate to diffusion capacitances. Thus, including these preferred body contacts incurs no additional cost over a typical state of the art CMOS technology. Moreover, the nitride stripe allows the body contact to be borderless for further area reduction over prior art approaches.

While the invention has been described in terms of preferred embodiments, those skilled in the art will recognize that the invention can be practiced with modification within the spirit and scope of the appended claims.

What is claimed is:

1. A field effect transistor (FET) comprising:
a semiconductor island on a dielectric layer;
a gate on said semiconductor island;
a conductive region of a first conduction type at either end of a channel region under said gate;
a perimeter stripe of dielectric material on said gate at one side of said channel region, said perimeter stripe overlapping a portion of said conductive region of said first conduction type;
a perimeter conductive region of a second conduction type in said semiconductor island along said one side and forming a junction with said conductive region of said first conduction type, wherein said junction is directly below said perimeter stripe, said gate extending beneath said perimeter stripe at least to said perimeter conductive region;
a body contact on said perimeter conductive region and adjacent to said perimeter stripe and said body contact contacting said channel region at said one side; and
a silicide contacting the perimeter conductive region, the body contact, and a sidewall of said one side of said gate.

2. A FET as in claim 1, wherein said semiconductor island is a silicon island on a buried oxide (BOX) layer of a silicon on insulator (SOI) chip.

3. A FET as in claim 2, wherein the body contact is at a body doped region, doped said second conduction type and extending from said channel into said perimeter conductive region.

4. A FET as in claim 3, wherein said SOI chip is a CMOS chip, said first conduction type is N-type and said second conduction type is P-type in NFETs and vice versa in PFETs.

5. A FET as in claim 3, wherein said body contact is a conductive material along a sidewall of said gate and connecting said gate to said channel region.

6. A FET as in claim 5, wherein said conductive material is silicide formed on said sidewall of said gate and said body contact.

7. A circuit including a plurality of FETs as in claim 3.

8. A FET as in claim 3, wherein said perimeter conductive region further extends along the conductive regions on either end of said gate.

9. A FET as in claim 1, wherein said perimeter stripe is a 30-40 nm thick nitride stripe.

10. A silicon on insulator (SOI) CMOS Integrated Circuit (IC) chip including a plurality of CMOS circuits, each of said CMOS circuits including a plurality of field effect transistors (FETs), at least one of said FETs comprising:
a silicon island on an oxide layer;
a gate above a channel, said gate being on an upper surface of said silicon island;
a pair of source/drain diffusions of a first conduction type at either end of said channel, said gate disposed between said pair of source/drain diffusions;
a perimeter stripe of dielectric material on said gate at one side of said channel, said perimeter stripe overlapping a source/drain extension from said source/drain diffusion;
a perimeter conductive region of a second conduction type in said silicon island along said one side and forming a junction with said source/drain extension, wherein said junction is directly below said perimeter stripe, said gate extending beneath said perimeter stripe at least to said perimeter conductive region; and
a body contact on said perimeter conductive region, said body contact contacting said channel at said one side; and
a silicide contacting the perimeter conductive region, the body contact, and a sidewall of said one side of said gate.

11. A SOI CMOS IC chip as in claim 10, wherein said body contact is at a body doped region, said body doped region being doped said second conduction type and extending from said channel into said perimeter conductive region.

12. A SOI CMOS IC chip as in claim 11, wherein said perimeter conductive region further extends along said pair of source/drain diffusions.

13. A SOI CMOS IC chip as in claim 12, wherein said perimeter conductive region is separated from said pair of source/drain diffusions by a body doped PN stripe.

14. A SOI CMOS IC chip as in claim 13, wherein said first conduction type is N-type and said second conduction type is P-type in NFETs and vice versa in PFETs.

15. A SOI CMOS IC chip as in claim 13, wherein said perimeter stripe extends along said perimeter conductive region and above said body doped PN stripe.

16. A SOI CMOS IC chip as in claim 10, wherein said perimeter stripe is a 30-40 nm thick nitride stripe.

17. A field effect transistor (FET) comprising:
a semiconductor island on a dielectric layer;
a gate on said semiconductor island;
a conductive region of a first conduction type at either end of a channel beneath said gate;
a PN perimeter stripe at one side of each said first type conductive region;
a perimeter conductive region of a second conduction type along said PN perimeter stripe and one side of said channel;
a dielectric material perimeter stripe overlapping said conductive region of said first conduction type, wherein said PN perimeter stripe is directly below said dielectric material perimeter stripe, said gate extending beneath said dielectric material perimeter stripe at least to said perimeter conductive region;
a body contact on said perimeter conductive region at said one side, said body contact contacting said channel under said gate at said one side; and
a silicide contacting the perimeter conductive region, the body contact, and a sidewall of said one side of said gate.

18. A FET as in claim 17, wherein said semiconductor island is a silicon island on a buried oxide (BOX) layer of a silicon on insulator (SOI) chip.

19. A FET as in claim 18, wherein the body contact is at a body doped region, doped said second conduction type and extending from said channel between PN perimeter stripes and into said perimeter conductive region.

20. A circuit including a plurality of FETs as in claim 19, wherein each said dielectric material perimeter stripe is a 30-40 nm thick nitride stripe.

* * * * *